(12) United States Patent
Ujike et al.

(10) Patent No.: US 9,867,292 B2
(45) Date of Patent: Jan. 9, 2018

(54) PRINTED WIRING BOARD

(71) Applicant: HONDA MOTOR CO., LTD., Tokyo (JP)

(72) Inventors: Hironori Ujike, Wako (JP); Atsushi Kurauchi, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/371,212

(22) Filed: Dec. 7, 2016

(65) Prior Publication Data

US 2017/0245369 A1     Aug. 24, 2017

(30) Foreign Application Priority Data

Feb. 19, 2016   (JP) ................. 2016-029661

(51) Int. Cl.
    *H05K 7/00*      (2006.01)
    *H05K 1/18*      (2006.01)
    *H05K 5/03*      (2006.01)
    *H05K 7/20*      (2006.01)

(52) U.S. Cl.
    CPC .............. *H05K 1/181* (2013.01); *H05K 5/03* (2013.01); *H05K 7/20409* (2013.01); *H05K 2201/06* (2013.01)

(58) Field of Classification Search
    USPC ................................. 361/760, 748, 807, 761
    See application file for complete search history.

(56) References Cited

U.S. PATENT DOCUMENTS

| 7,385,792 B2 * | 6/2008 | Kanayama | .............. H02M 3/00 |
| | | | 174/16.2 |
| 2011/0090656 A1 * | 4/2011 | Hamatani | ........... H01L 23/3107 |
| | | | 361/761 |

\* cited by examiner

*Primary Examiner* — Andargie M Aychillhum
(74) *Attorney, Agent, or Firm* — Mori & Ward, LLP

(57) ABSTRACT

A printed wiring board includes a first outer surface, a second outer surface, and an electronic circuit. The second outer surface is opposite to the first outer surface. The electronic circuit includes at least one specific design circuit block and at least one common design circuit block. The at least one specific design circuit block is provided on the first outer surface and designed in accordance with a specification of a device to which the printed wiring board is applied. The at least one common design circuit block is for a common use regardless of the specification of the device. The at least one common design circuit block is provided on the second outer surface.

11 Claims, 8 Drawing Sheets

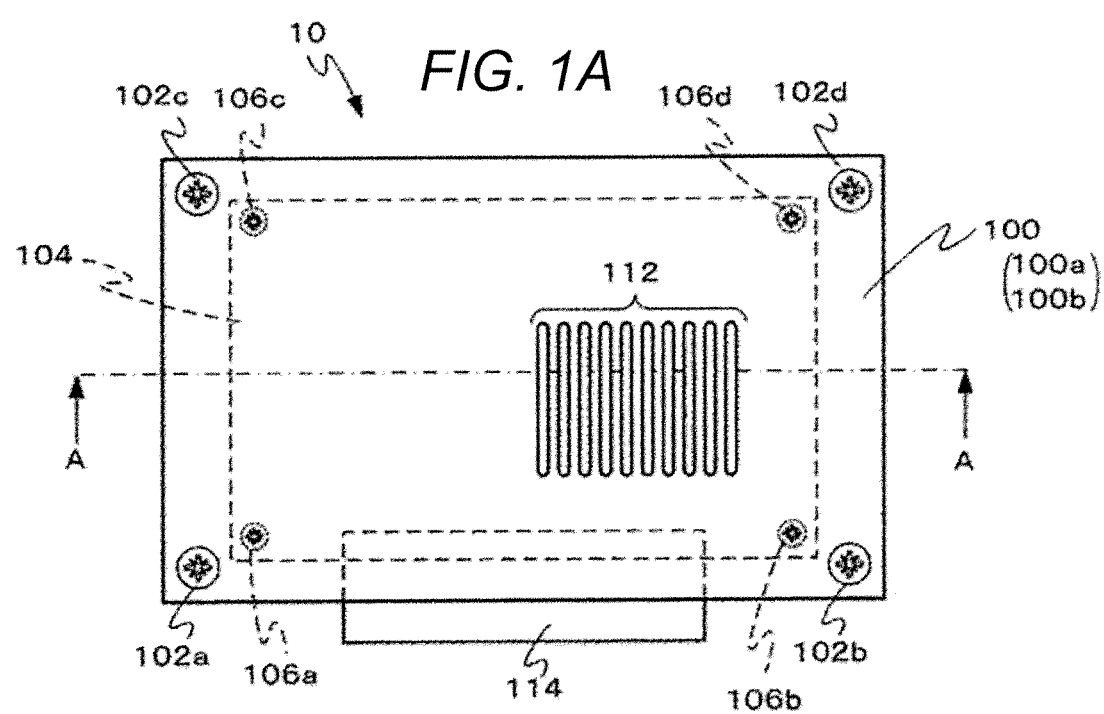

A-A cross section viewed in the arrow direction

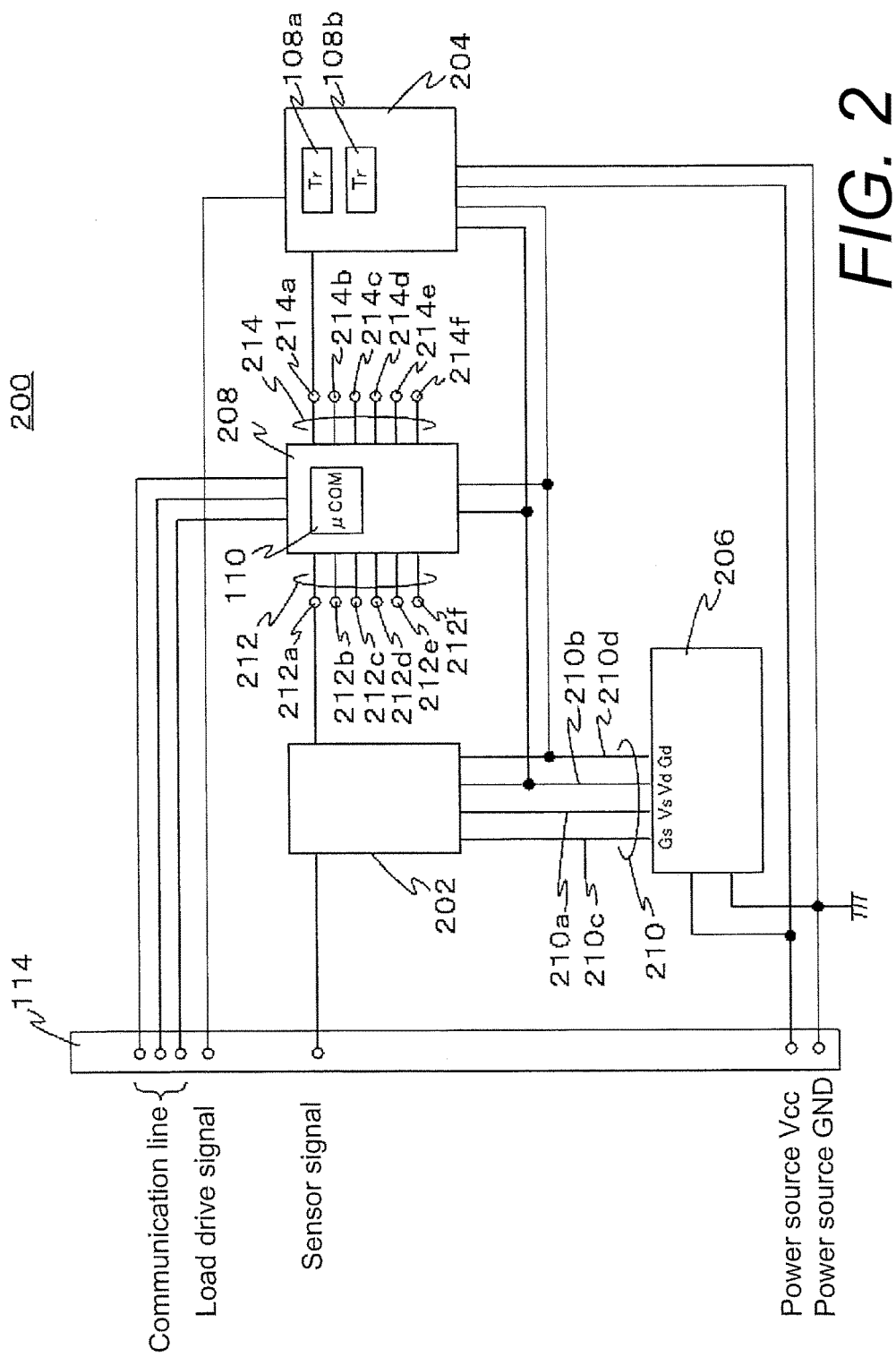

Printed wiring board 104
Back surface perspective view

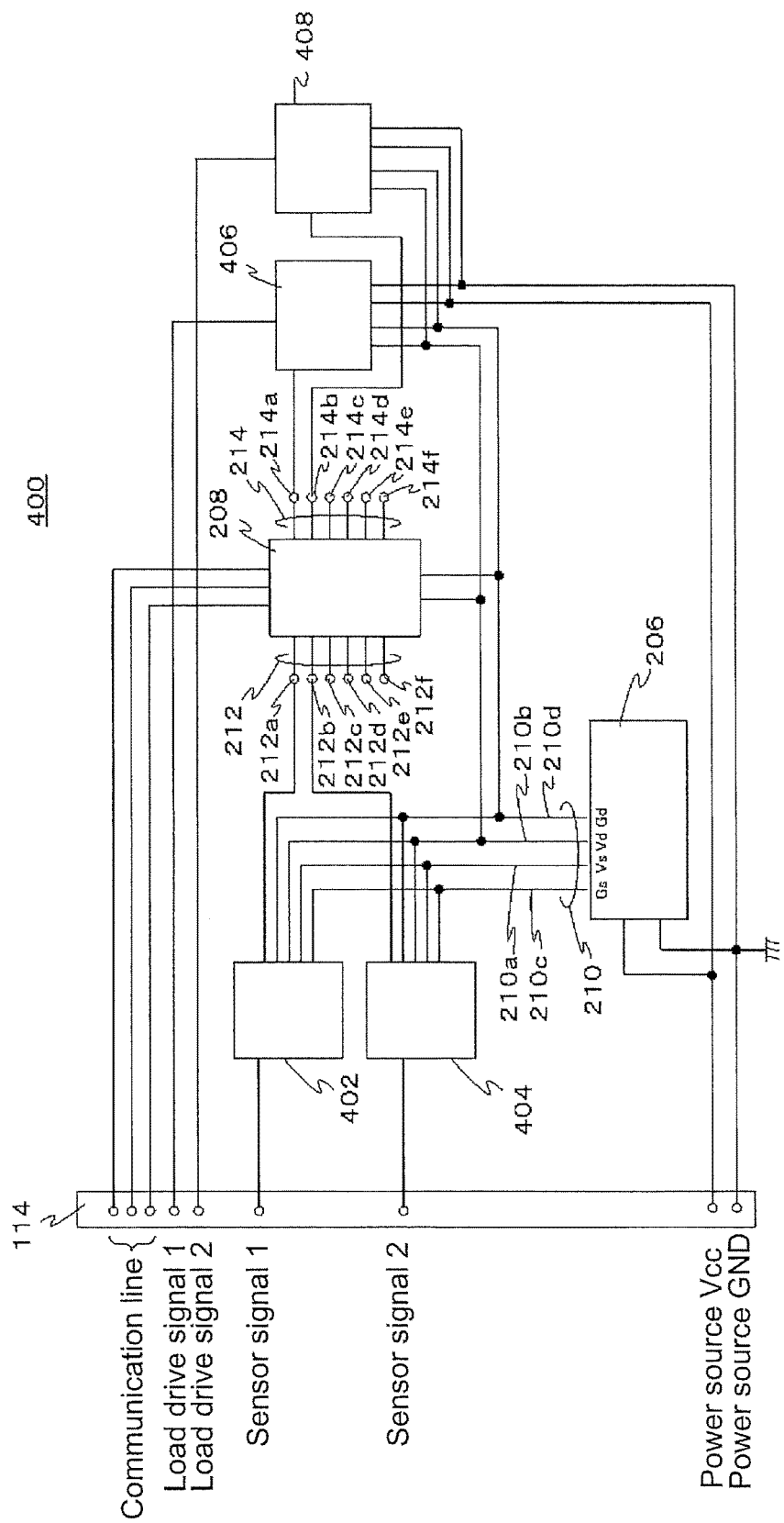

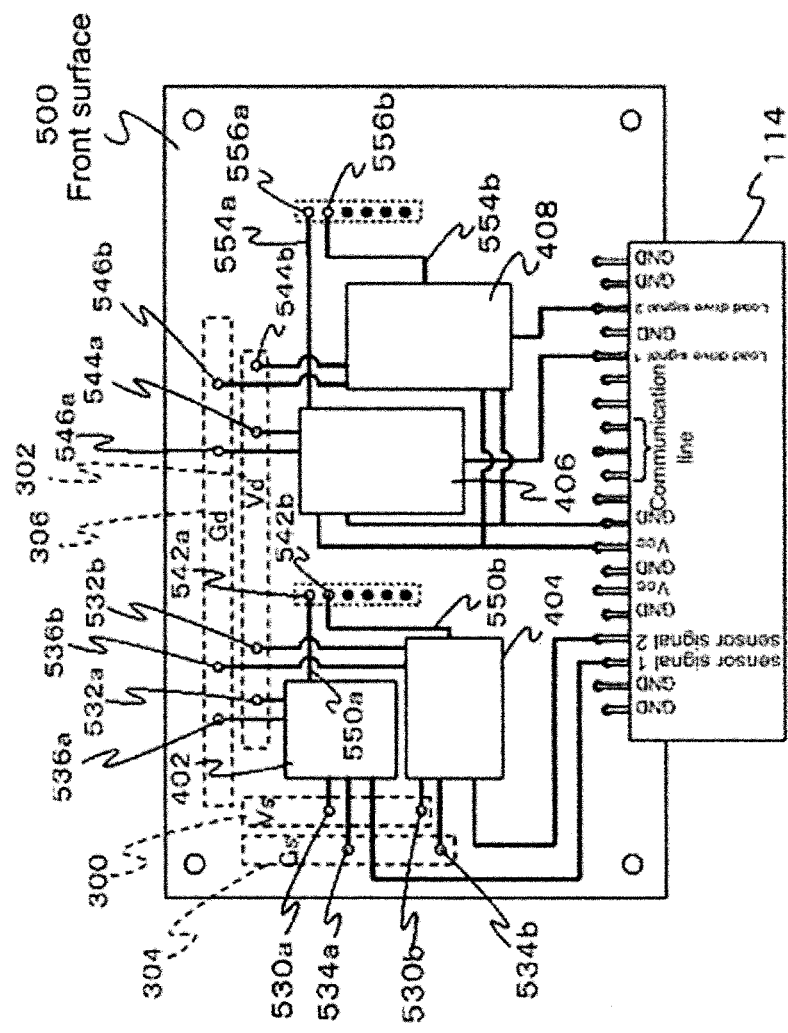

PRINTED WIRING BOARD

CROSS-REFERENCE TO RELATED APPLICATIONS

The present application claims priority under 35 U.S.C. §119 to Japanese Patent Application No. 2016-029661, filed Feb. 19, 2016. The contents of this applications are incorporated herein by reference in their entirety.

BACKGROUND OF THE INVENTION

Field of the Invention

The present invention relates to a printed wiring board.

Discussion of the Background

Hitherto, in the printed wiring board constituting an electronic circuit, electronic parts are mounted on one outer layer (for example, a front surface), and the wiring pattern for providing a connection between the electronic parts is formed on the one outer layer or the other outer layer (for example, a back surface). Moreover, in the printed wiring board constituting a complicated electronic circuit, the electronic circuit is formed such that the wiring board is composed of a plurality of layers in such a way as to mount the electronic parts on the front surface and to form a wiring layer and an electric power supply layer or a ground layer (for example, an analog ground layer or a digital ground layer) on the back surface and an inner layer, for example.

The design of such printed wiring board is performed separately and independently in accordance with a function and a specification of the electronic circuit to be formed on the printed wiring board. Therefore, since a lack of commonality and versatility of the design between products is easily caused, and the applicability from one design to another design is poor, much labor and time are required for each design.

For example, a control device such as an electronic control unit (ECU) and the like to be used for a vehicle includes a small signal processing circuit configured to receive a signal from a sensor which indicates a working condition such as a rotational frequency of an engine, an opening degree of a throttle and the like for example, and to perform an amplification and the like of the signal, an arithmetic processing circuit configured to perform arithmetic processing based on the signal processed by the small signal processing circuit and to determine an control amount of load such as an actuator and the like which operates the throttle, and a driving circuit for driving the load in accordance with the determined control amount.

Then, for example, if the specifications of the engine and the performance and function (for example, existence or nonexistence of an idle stop system and the like) required therefor are different, the number and kinds of the sensors for detecting the engine condition, and/or the number and kinds of the actuators for determining the movement of the engine are varied, so that the printed wiring boards constituting the electronic control circuit are separately designed in accordance with those number and kinds accordingly.

However, the arithmetic processing circuit constituting a part of the electronic control unit, generally, includes a computer which can change the movement flexibly by software program. Therefore, when the number and kinds of the sensor signals and/or the number and kinds of the loads are varied, it is possible to deal with it by changing the executing software program of the computer, so that, essentially, the standardization, generalization or commonization of the design is easy to be performed.

Precisely, in the above-mentioned control circuit, although there is the sharable circuit part such as the arithmetic processing circuit including the computer, the whole of the printed wiring board is designed separately attributable to that one electronic circuit is formed in a state where the sharable circuit part and the circuit part to be designed separately in accordance with the specification and the like of the product to be applied are mixed.

SUMMARY OF THE INVENTION

According to one aspect of the present invention, a printed wiring board which constitutes an electronic circuit formed of at least two circuit blocks includes electric parts being mounted on each of two outer layers of the printed wiring board so as to form at least one of the circuit blocks, wherein at least one of the circuit blocks formed on one of the outer layers is a separate design circuit block which is designed separately in accordance with a specification of a device to which the printed wiring board is applied, and at least one of the circuit blocks formed on the other of the outer layers is a common design circuit block which is used in common irrespective of the specification of the device to which the printed wiring board is applied.

According to another aspect of the present invention, a printed wiring board includes a first outer surface, a second outer surface, and an electronic circuit. The second outer surface is opposite to the first outer surface. The electronic circuit includes at least one specific design circuit block and at least one common design circuit block. The at least one specific design circuit block is provided on the first outer surface and designed in accordance with a specification of a device to which the printed wiring board is applied. The at least one common design circuit block is for a common use regardless of the specification of the device. The at least one common design circuit block is provided on the second outer surface.

According to further aspect of the present invention, an electronic device includes the printed wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 1A, 1B, and 1C are views showing structures of an electronic device to which a printed wiring board according to an embodiment of the present invention is applied;

FIG. 2 is a view showing an example of a structure of an electronic circuit formed on the printed wiring board according to the embodiment of the present invention;

FIG. 4 is a view showing another example of the electronic circuit; and

FIGS. 5A and 5B are views showing examples of wiring patterns of the printed wiring board constituting the electronic circuit of FIG. 4, which are designed by utilizing the printed wiring board shown in FIGS. 3A and 3B.

DESCRIPTION OF THE EMBODIMENTS

Figure 1B:
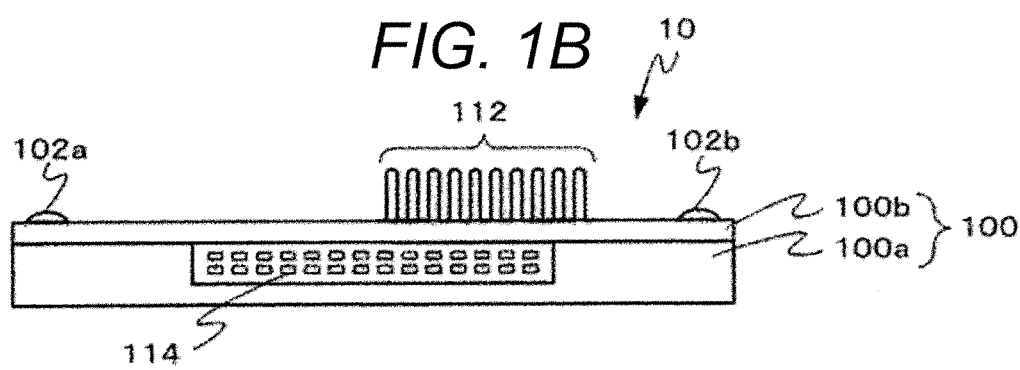

The embodiments will now be described with reference to the accompanying drawings, wherein like reference numerals designate corresponding or identical elements throughout the various drawings.

Hereinafter, an embodiment of the present invention will be explained with reference to drawings. An electronic device employing a printed wiring board shown herein as the embodiment of the present invention is an electronic control unit (ECU) which is mounted on a vehicle and configured to control at least one of movements of the vehicle, for example. However, the printed wiring board according to the embodiment of the present invention may be applied widely to general electronic devices in a similar manner, without limiting to this and inclusive of other uses.

Figure 1C:
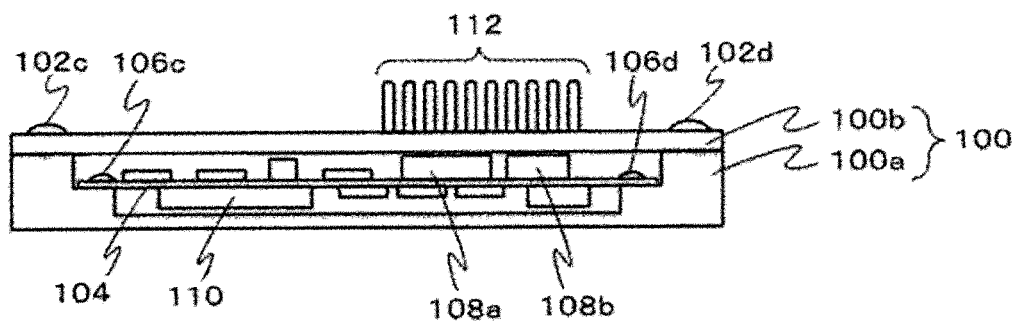

FIG. 1 is a view showing a structure of an electronic device to which a printed wiring board according to an embodiment of the present invention is applied. FIG. 1A is a top plan view of the electronic device 10, FIG. 1B is a front view thereof, and FIG. 1C is a cross sectional view thereof taken on line A-A as seen in the direction of arrows. The electronic device 10 includes an electrically conductive casing 100 which is formed in a state where a base 100a and a cover 100b each made of electrically conductive material (for example, metal such as aluminium and the like or electrically conductive resin) are fixedly secured to each other by screws 102a~102d, and the printed wiring board 104 which is accommodated in the casing 100.

The printed wiring board 104 is fixedly secured to the base 100a by screws 106a~106d, and has electric parts including electric parts 108a, 108b mounted on an upper surface (hereinafter, referred to as front surface) of FIG. 1C while having electric parts including an electric part 110 mounted on a lower surface (hereinafter, referred to as back surface) of the drawing, whereby to constitute an electronic circuit as a whole.

In a part of the cover 100b forming the casing 100, there is provided a radiator 112 for radiating heat generated from the electric parts 108a, 108b which are heat generating parts, for example. Thermal contact between each of the electric parts 108a, 108b and the cover 100b may be established directly by physically contacting the electric parts 108a, 108b with the cover 100b or indirectly by filling, for example, radiating grease (not shown) into between each of the electric parts 108a, 108b and the cover 100b.

Further, a connector 114 for connecting the electronic circuit constituted by the printed wiring board 104 to an external system and device is mounted on the printed wiring board 104 in such a manner as to project outwardly from the casing 100. Herein, the "connection" means an electrical connection in terms of direct current, unless otherwise specified.

The electronic circuit formed on the printed wiring board 104 by employing the electric parts 108a, 108b, 110, etc. is constituted by two kinds of circuit blocks composed of a separate design circuit block (a specific design circuit block) which is designed separately in accordance with a specification (including the function, required performance and characteristic) (the same applies to the following) of the electronic device 10 and a common design circuit block which is used in common irrespective of the specification of the electronic device 10.

FIG. 2 is a view showing an example of a structure of the electronic circuit formed on the printed wiring board 104. The electronic circuit 200 shown in the drawing is constituted by two separate design circuit blocks 202 and 204 and by two common design circuit blocks 206 and 208.

Herein, the separate design circuit block 202 is a small signal processing circuit block including an analog circuit which performs processing of a sensor signal (for example, amplification of the sensor signal, noise elimination, analog-to-digital conversion, etc.) from a sensor (not shown) configured to detect a condition of a control object to be controlled by the electronic device 10 functioning as the electronic control unit, for example. Moreover, the separate design circuit block 204 is a load drive circuit block including an analog circuit which outputs a load drive signal for driving one control object (not shown), and includes the electric parts 108a, 108b which are power transistors such as MOS-FET for driving the load and the like, for example.

The common design circuit block 206 is an electric power supply circuit block for example, and is configured to convert a power supply voltage Vcc supplied from an outside through the connector 114, into a power supply voltage Vs for the small signal processing circuit and a power supply voltage Vd for a logical circuit (digital circuit), thereby to output the converted power supply voltages. Moreover, the common design circuit block 206 provides signal ground Gs which is a ground line for the small signal processing circuit and digital ground Gd which is a ground line for the logical circuit (digital circuit). In other words, the common design circuit block 206 has an output line group 210 composed of four output lines 210a, 210b, 210c, 210d which provide Vs, Vd, Gs, Gd, respectively.

The Vs and Gs are supplied to the separate design circuit block 202 which is the small signal processing circuit block, while Vd and Gd are supplied to the separate design circuit blocks 202, 204 and the common design circuit block 208.

The common design circuit block 208 is an arithmetic processing circuit block including a digital arithmetic processing circuit which is configured to arithmetically process a signal from the separate design circuit block 202 and to output a signal of a result of the arithmetic processing to the separate design circuit block 204, for example. The common design circuit block 208 includes the electric part 110 which is a microcomputer configured to perform the arithmetical processing based on a software program, for example.

Further, the common design circuit block 208 includes an input line group 212 composed of six input lines 212a, 212b, 212c, 212d, 212e, 212f which receive processed sensor signals and the like, and an output line group 214 composed of six output lines 214a, 214b, 214c, 214d, 214e, 214f which output a signal of a result of the arithmetic processing and the like. These input line group 212 and output line group 214 are constituted by lines each connected to a plurality of input ports and a plurality of output ports which are included in I/O ports of the electric part 110 formed as the microcomputer, for example.

In the electronic circuit 200 shown in FIG. 2, the output line of the separate design circuit block 202 formed as the small signal processing circuit block is connected to the first input line 212a from above in the drawing of the input line group 212 of the common design circuit block 208. The common design circuit block 208 formed as the arithmetic processing circuit block is configured to arithmetically process a signal inputted from the input line 212a and to output a signal indicating the result of the arithmetic processing to the first output line 214a from above in the drawing of the output line group 214. Then, the signal indicating the result of the arithmetic processing is inputted through the output line 214a to the separate design circuit block 204. In addition, the common design circuit block 208 formed as the arithmetic processing circuit block performs communication with the external device through the connector 114 by three communication lines.

The separate design circuit block 204 formed as the load drive circuit block generates a load drive signal based on the signal inputted through the output line 214a and outputs the load drive signal to the outside through the connector 114.

Herein, each of the separate design circuit block and the common design circuit block shown in this embodiment is an example, the separate design circuit block may include a digital circuit as far as it is designed separately in accordance with the specification of the electronic device 10, while the common design circuit block may include an analog circuit as far as it is used in common irrespective of the specification of the electronic device 10.

The electronic circuit 200 shown in FIG. 2 is formed on the printed wiring board 104. More concretely, the electric parts are mounted in such a manner as to form the at least one circuit block on each of two outer layers of the printed wiring board 104. In this embodiment, particularly, the electric parts constituting the separate design circuit blocks 202, 204 are mounted on one outer layer (for example, the front surface or a first outer surface, namely, the upper surface in FIG. 1C) of the printed wiring board 104 so as to form the separate design circuit blocks 202, 204, while the electric parts constituting the common design circuit blocks 206, 208 are mounted on the other outer layer (for example, the back surface or a second outer surface, namely the lower surface in FIG. 1C) of the printed wiring board 104 so as to form the common design circuit blocks 206, 208.

With this configuration, the other outer layer (hereinafter, referred to as the back surface) of the printed wiring board 104 on which the common design circuit blocks 206, 208 are formed is available for the common design (namely, pattern design capable of being used in common for various kinds of devices having different specifications) independently of the specification of the electronic device 10.

Further, in this embodiment, as referred to later, wiring patterns constituting the output lines 210a~210c of the common design circuit block 206 formed on the back surface of the printed wiring board 104, the input lines 212a~212f and the output lines 214a~214f of the common design circuit block 208 (namely, output lines 300a~300c, input lines 310a~310f and output lines 314a~314f to be referred to later) are formed so as to extend to a predetermined prescribed position located on a board plane of the printed wiring board 104, respectively.

Then, the connection between the common design circuit block 206 and each of the separate design circuit blocks 202, 204, and the connection between each of the output line and the input line of the common design circuit block 208 and each of the separate design circuit blocks 202, 204 are provided through vias located in the above prescribed position to which corresponding wiring patterns extend, respectively.

Figure 3A:
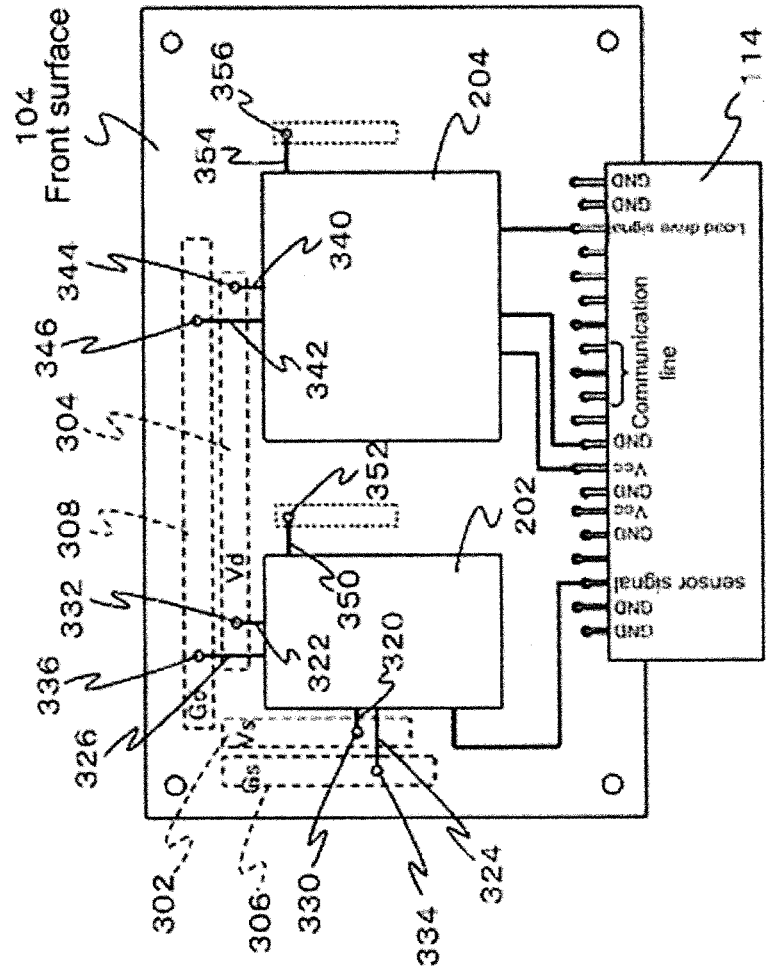
FIGS. 3A and 3B are views showing examples of wiring patterns on a front surface and a back surface of the printed wiring board, respectively, according to the embodiment of the present invention.
Figure 3B:
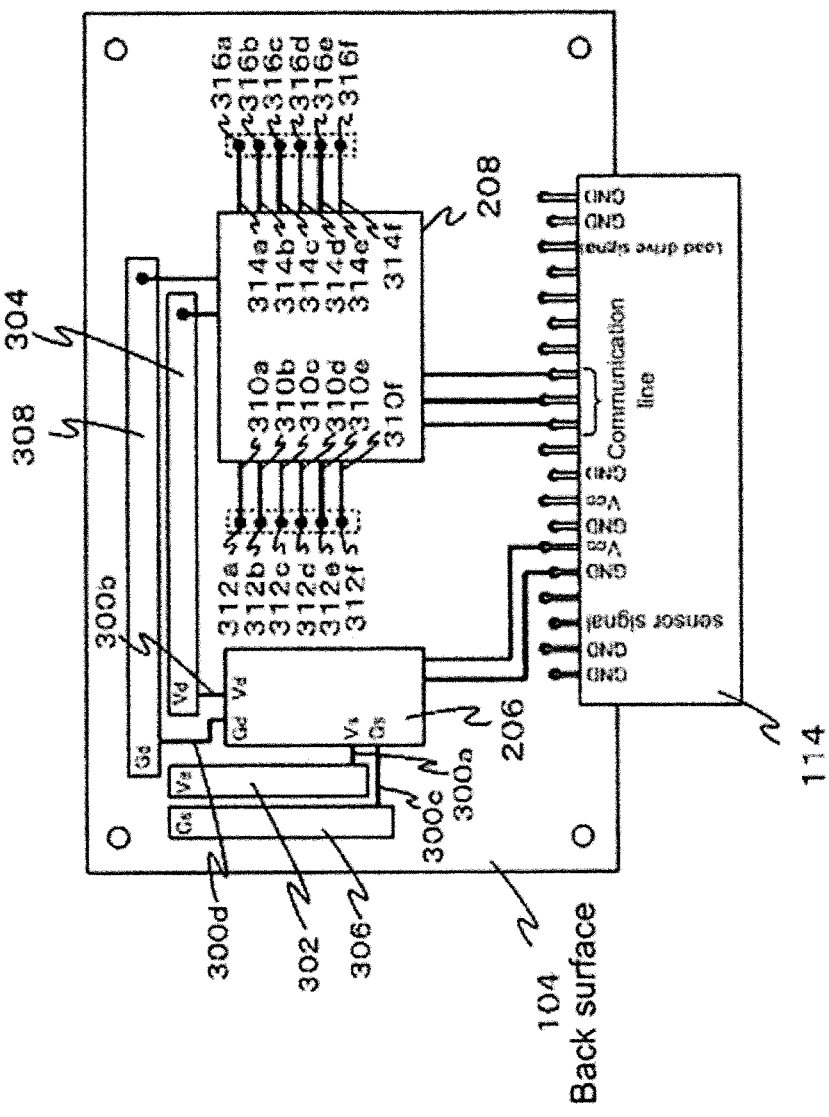

FIGS. 3A and 3B are views showing examples of the wiring patterns on the front surface and the back surface of the printed wiring board 104, respectively. FIG. 3A is a view showing an example of the wiring pattern on the front surface of the printed wiring board 104, and FIG. 3B is a view showing an example of the wiring pattern on the back surface of the printed wiring board 104. Herein, in order to facilitate the understanding with respect to the mutual positional relationship between the wiring pattern on the front surface and the wiring pattern on the back surface, a view (perspective view) seeing the back surface of the printed wiring board 104 through the front surface is shown by solid lines. Accordingly, note that actual wiring patterns as seen from the back surface of the printed wiring board 104 are wiring patterns illustrated by inverting the illustration of FIG. 3B vertically and horizontally.

The common design circuit blocks 206, 208 are formed on the back surface shown in FIG. 3B. The common design circuit block 206 formed as the power supply circuit block is connected to one of Vcc pins and one of GND pins of the connector 114 thereby to obtain the power supply voltage Vcc and a ground potential GND from an outside power source. Particularly, the output lines 300a, 300b, 300c, 300d each corresponding to the four output lines 210a~210d of Vs, Vd, Gs and Gd constituting the output line group 210 of the common design circuit block 206 are connected to power supply patterns 302, 304 and ground patterns 306, 308 which are arranged in the predetermined prescribed position on the board surface of the printed wiring board 104, respectively. In other words, each of positions (or regions) in which the power supply patterns 302, 304 and the ground patterns 306, 308 are arranged corresponds to each of the predetermined prescribed positions to which the four output lines 300a, 300b, 300c, 300d of Vs, Vd, Gs and Gd extend.

Further, the common design circuit block 208 is connected to the power supply pattern 304 and the ground pattern 308 thereby to obtain each of the power supply voltage Vd and the ground potential Gd. In addition, three communication lines of the common design circuit block 208 are connected to corresponding three pins of the connector 114.

Particularly, the input lines 310a, 310b, 310c, 310d, 310e, 310f each corresponding to the six input lines 212a~212f constituting the input line group 212 of the common design circuit block 208 formed as the arithmetic processing circuit block have wiring patterns configured, respectively, in such a manner as to extend to lands 312a, 312b, 312c, 312c, 312d, 312e, 312f, for example, which are arranged in the predetermined prescribed positions on the board surface of the printed wiring board 104.

Further, the output lines 314a, 314b, 314c, 314d, 314e, 314f each corresponding to the six output lines 214a~214f constituting the output line group 214 of the common design circuit block 208 have wiring patterns configured, respectively, in such a manner as to extend to lands 316a, 316b, 316c, 316d, 316e, 316f, for example, which are arranged in the predetermined prescribed positions on the board surface of the printed wiring board 104.

In other words, the respective positions on the printed wiring board 104 in which the lands 312a~312f are arranged correspond to the respective predetermined prescribed positions to which the six input lines 310a~310f of the common design circuit block 208 extend, and the respective positions on the printed wiring board 104 in which the lands 316a~316f are arranged correspond to the respective predetermined prescribed positions to which the six output lines 314a~314f of the common design circuit block 208 extend.

On the other hand, the separate design circuit blocks 202, 204 are formed on the front surface of the printed wiring board 104 shown in FIG. 3A. Particularly, in this embodiment, patterns on the front surface of the printed wiring board 104 are formed in such a manner as to provide a necessary connection between each of the separate design circuit blocks 202, 204 and each of the common design circuit blocks 206, 208 in the predetermined prescribed positions (namely, the power supply patterns 302, 304 and the ground patterns 306, 308) to which the output lines 300a~300d of the common design circuit block 206 constituted on the back surface of the printed wiring board 104 extend, in the predetermined prescribed positions (namely, positions of the lands 312a~312f) to which the input lines 310a~310f of the common design circuit block 208 extend, and in the predetermined prescribed positions (namely, the lands 316a~316f) to which the output lines 314a~314f of the common design circuit block 208 extend.

To be more precise, as shown in FIG. 3A, power supply wiring patterns 320, 322 and ground wiring patterns 324, 326 of the separate design circuit block 202 are connected to Vs, Vd, Gs and Gd outputted from the common design circuit block 206 formed as the power supply circuit block, by vias 330, 332 and 334, 336 which are provided in the power supply patterns 302, 304 and the ground patterns 306, 308 (namely, in the predetermined prescribed positions to which the output lines 300a, 300b and 300c, 300d of the common design circuit block 206 extend). Similarly, a power supply wiring pattern 340 and a ground wiring pattern 342 of the separate design circuit block 204 are connected to Vd and Gd outputted from the common design circuit block 206 formed as the power supply circuit block, by vias 344 and 346 provided in the power supply pattern 304 and the ground pattern 308.

Further, an output line 350 of the separate design circuit block 202 formed as the small signal processing circuit block is connected to the input line 310a (corresponding to the input line 212a of FIG. 2) of the common design circuit block 208 formed as the arithmetic processing circuit block by a via 352 provided in the position of the land 312a (namely, the predetermined prescribed position to which the input line 310a extends). Similarly, an input line 354 of the separate design circuit block 204 formed as the load drive circuit block is connected to the output line 314a (corresponding to the output line 214a of FIG. 2) of the common design circuit block 208 formed as the arithmetic processing circuit block, by locating a via 356 in the position of the land 316a (namely in the prescribed position to which the output line 314a extends).

The printed wiring board 104 having the above configuration is provided on the back surface thereof with only the common design circuit blocks 206, 208 which are used in common irrespective of the specification, etc. of the electronic device 10. The wiring patterns are formed in such a manner that the output lines 300a, 300b and 300c, 300d of the common design circuit block 206 which is required to be connected to the separate design circuit blocks 202, 204 mounted on the front surface, and the input liens 310a~310f and the output lines 314a~314f of the common design circuit block 208 each extend to the predetermined prescribed positions on the board surface of the printed wiring board 104 (namely, the positions of the power supply patterns 302, 304, the ground patterns 306, 308, the lands 312a~312f and the lands 316a~316f).

Therefore, the wiring patterns on the back surface of the printed wiring board 104 are designed in advance as common patterns to be used in common irrespective of the specification, etc. of the electronic device 10, and thereafter only the wiring patterns on the front surface of the printed wiring board 104 can be designed separately in accordance with the design contents of the separate design circuit block. As a result, after the common patterns on the back surface are designed, only the pattern designing of the front surface (the surface on which the separate design circuit block is mounted) is performed while utilizing the common design patterns in the case of modifying the specification of the electronic device 10 and at the time of designing the electronic device in accordance with another specification, so that the design man-hour of the printed wiring board can be reduced or the labor saving in the designing work can be realized.

Further, the load control circuit block constituting the separate design circuit block 204, 406, 408, generally, includes heat generating parts (in this embodiment, the electric parts 108a, 108b) such as output transistors and the like. Therefore, as seen in this embodiment, when the separate design circuit block 204, etc. are mounted on the front surface constituting one outer layer of the printed wiring board 104 and the heat generating parts 108a, 108b mounted on the front surface as shown in FIG. 1 for example are configured to radiate heat to the cover 100b of the casing, it is possible to radiate heat efficiently. In addition, in the case of modifying the specification of the electronic device 10 or in the case of designing the electronic device in accordance with another specification, for example, it is sufficient that only the cover 100b in which the position of the radiator 112 is changed is designed, without modifying the design of the base 100a even if the position on the front surface for mounting the load control circuit block is different, so that the design man-hour of the casing 100 is also reduced.

Hereinafter, the printed wiring board to be designed by utilizing the common design patterns shown in FIG. 3B will be explained.

FIG. 4 is a view showing another example of the electronic circuit. This electronic circuit 400 is formed by changing the design of the electronic circuit 200 of FIG. 2 in accordance with the modification of the specification of the electronic device 10 or by being designed for another electronic device in accordance with the different specification from the electronic device 10. In FIG. 4, component elements identical to the component elements of the electronic circuit shown in FIG. 2 are given reference characters identical to the reference characters shown in FIG. 2, and the above referred explanation with reference to FIG. 2 will be applied accordingly.

The electronic circuit 400 shown in FIG. 4, similarly to the electronic circuit 200 shown in FIG. 2, has the common design circuit block 206 formed as the power supply circuit block and the common design circuit block 208 formed as the arithmetic processing circuit block. However, while the electronic circuit 200 includes the separate design circuit block 202 formed as one small signal processing circuit block and the separate design circuit block 204 formed as one load drive circuit block, the electronic circuit 400 includes separate design circuit blocks 402, 404 formed as two small signal processing circuit blocks and separate design circuit blocks 406, 408 formed as two load drive circuit blocks.

The separate design circuit blocks 402, 404 formed as the two small signal processing circuit blocks, for example, each are configured to receive and process sensor signals 1 and 2 from mutually different two sensors (not shown) thereby to output these processed results to the common design circuit block 208 formed as the arithmetic processing circuit block, respectively.

The common design circuit block 208 formed as the arithmetic processing circuit block receives and arithmetically processes the processed results with respect to two sensor signals from each of the two separate design circuit blocks 402, 404 thereby to output control amounts of each of two control loads (not shown) as signals indicating arithmetically processed results to each of the separate design circuit blocks 406, 408 formed as the two load drive circuit blocks.

Herein, the output signals (namely, the processed sensor signals) from the two separate design circuit blocks 402, 404 are inputted to the input lines 212a and 212b of the common design circuit block 208, respectively. Moreover, the two signals indicating the arithmetically processed results outputted from the common design circuit block 208 each are outputted from the output lines 214a and 214b and inputted to the separate design circuit blocks 406, 408.

Figure 5B:
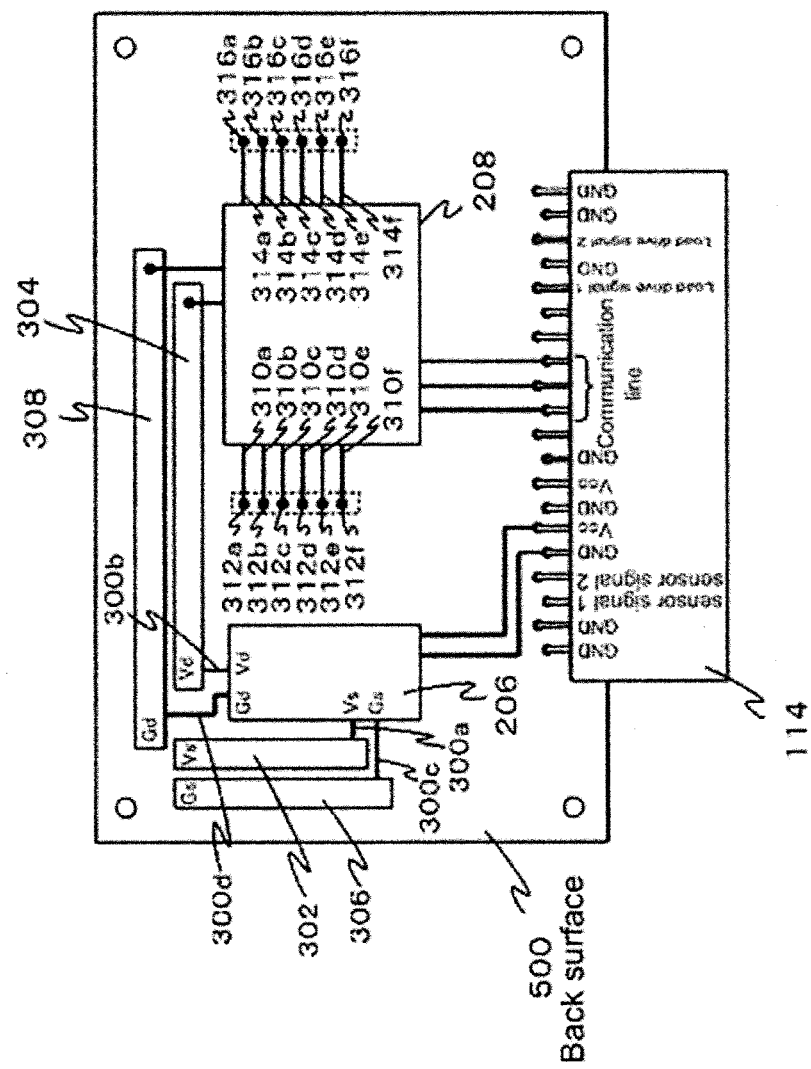

FIGS. 5A and 5B are views showing examples of wiring patterns of a printed wiring board 500 constituting the electronic circuit 400 of FIG. 4, in which the printed wiring board 500 is designed by utilizing the common design patterns shown in FIGS. 3A and 3B. FIG. 5A is a view showing wiring patterns on the front surface of the printed wiring board 500, and FIG. 5B is a view showing wiring patterns on the back surface thereof. In FIG. 5A, component elements identical to the component elements shown in FIG. 3B are given reference characters identical to the reference characters shown in FIG. 3B, and the above referred explanation with reference to FIG. 3B will be applied accordingly. Herein, in FIG. 5B, similarly to FIG. 3B, a view (perspective view) seeing the back surface of the printed wiring board 500 through the front surface is shown by solid lines. Accordingly, note that actual wiring patterns as seen from the back surface of the printed wiring board 500 are wiring patterns illustrated by inverting the wiring patterns of FIG. 5B vertically and horizontally. In addition, among the wiring patterns illustrated in FIGS. 5A and 5B, a part of the wiring pattern which crosses other wiring pattern in a straddling manner is formed in accordance with the publicly known art (for example, it is configured so as to be connected through a via to the wiring pattern provided in other wiring layer and to take a long way around).

Similarly to the printed wiring board 104, on the front surface of the printed wiring board 500 there are formed separate design circuit blocks (namely, separate design circuit blocks 402~408), and on the back surface of the printed wiring board 500 there are formed only the common design circuit blocks (namely, common design circuit blocks 206, 208).

Then, on the back surface of the printed wiring board 500 shown in FIG. 5B, there are formed the same wiring patterns as those of FIG. 3B (wiring patterns utilizing the printed wiring board 104 of FIG. 3B as common wiring patterns or common design patterns).

On the other hand, different from FIG. 3A, the separate design circuit blocks 402 and 404 which are the two small signal processing circuit blocks, and the two load drive circuit blocks 406 and 408 are formed on the front surface shown in FIG. 5A. However, similarly to FIG. 3A, these separate design circuit blocks 402~408 are connected to the common design circuit blocks 206, 208 on the back surface by providing vias in the predetermined prescribed positions to which the input lines and/or the output lines of the common design circuit blocks 206, 208 extend.

More concretely, the separate design circuit block 402 is connected to each of the output lines 300a~300d of Vs, Vd, Gs and Gd outputted from the common design circuit block 206 formed as the power supply circuit block, through vias 530a, 532a and 534a, 536a provided in the power supply patterns 302, 304 and the ground patterns 306, 308 (namely, in the prescribed positions to which the output lines 300a~300d of the common design circuit block 206 extend).

Further, the separate design circuit block 404 is connected to each of the output lines 300a~300d of Vs, Vd, Gs and Gd outputted from the common design circuit block 206, through vias 530b, 532b and 534b, 536b provided in the power supply patterns 302, 304 and the ground patterns 306, 308 (namely, in the prescribed positions to which the output lines 300a~300d of the common design circuit block 206 extend).

Similarly, the separate design circuit block 406 is connected to the output lines 300b, 300d of Vd and Gd outputted from the common design circuit block 206, by vias 544a and 546a provided in the power supply pattern 304 and the ground pattern 308 (namely, in the prescribed positions to which the output lines 300b, 300d of the common design circuit block 206 extend). Moreover, the separate design circuit block 408 is connected to the output lines 300b, 300d of Vd and Gd outputted from the common design circuit block 206, by vias 544b and 546b provided in the power supply pattern 304 and the ground pattern 308 (namely, in the prescribed positions to which the output lines 300b, 300d of the common design circuit block 206 extend).

Further, output lines 550a, 550b of the separate design circuit blocks 402, 404 formed as the small signal processing circuit blocks are connected to the input lines 310a, 310b (each corresponding to the input lines 212a, 212b of FIG. 4) of the common design circuit block 208 formed as the arithmetic processing circuit block, by vias 542a and 542b provided in the positions corresponding to the position of the lands 312a, 312b (namely, in the positions to which the input lines 310a, 310b extend).

Further, input lines 554a, 554b of the separate design circuit blocks 402, 404 formed as the load drive circuit blocks are connected to the output lines 314a, 314b (each corresponding to the output lines 214a, 214b of FIG. 4) of the common design circuit block 208 formed as the arithmetic processing circuit block, by having vias 556a and 556b provided in the positions corresponding to the position of the lands 316a, 316b (namely, in the positions to which the output lines 314a, 314b extend).

Like this, by utilizing, as the common design circuit patterns, the wiring patterns with respect to the common design circuit blocks 206, 208 which are employed on the back surface of the printed wiring board 104 constituting the electronic circuit 200, it is possible to design the printed wiring board 500 for constituting the electronic circuit 400 provided with the separate design circuit blocks 402~408, which is different from the electronic circuit 200. To put it briefly, at the time of designing the printed wiring board 500, since it is sufficient that only the pattern designing of the front surface to mount the separate design circuit blocks 402~408 thereon is performed, the design man-hour of the printed wiring board 500 can be reduced.

As explained above, in the printed wiring board 104 according to this embodiment, the electric parts are mounted on one outer layer (for example, the front surface) of the printed wiring board 104 in such a manner as to constitute the separate design circuit blocks 202, 204 which are designed separately in accordance with the specification of the electronic device 10 to which the printed wiring board 104 is applied, and the electric parts are mounted on the other outer layer (for example, the back surface) in such a manner as to constitute the common design circuit blocks 206, 208 which are employed in common irrespective of the specification of the electronic device 10. With this configuration, since the wiring patterns of the other outer layer on which the common design circuit blocks 206, 208 are mounted are utilized, as the common design patterns, for other printed wiring board (for example, the printed wiring board 500), the design man-hour of the other printed wiring board can be reduced or the labor saving in the designing work can be realized.

Herein, in the above embodiment, the prescribed positions (the land 312a, etc.) to which the input line and output line of the common design circuit block (208, etc.) extend are configured to be provided on the back surface of the printed wiring board on which the common design circuit block is formed. However, without limiting to this, in the case where the printed wiring board includes at least one inner layer for example, the prescribed positions (the land 312a, etc.) may be configured to be located on the at least one inner layer. In this case, all of the prescribed positions are not necessarily required to be located on the one inner layer, a plurality of prescribed positions may be configured so as to be located on a plurality of inner layers in a dispersed manner. Further, in the these cases, the wiring patterns of each of the one outer layer on which the common design circuit block is mounted and the at least one inner layer in which the prescribed position is located, may be used collectively as the common design patterns utilizable for the design of other printed wiring board.

Further, in the above embodiment, the input line and the output line of the separate design circuit block (204, etc.) mounted on the front surface of the printed wiring board 104 are configured to be extended, by the wiring patterns located on the front surface, to the prescribed positions (land 312a, etc.) to which the input line and the output line of the common design circuit block (208, etc.) extend. However, without limiting to this, in the case where the printed wiring board is configured to include at least one inner layer for example, the input line and the output line of the separate design circuit block (204, etc.) may be connected through the at least one inner layer to the prescribed positions (the land 312a, etc.).

According to an aspect of the present invention, a printed wiring board which constitutes an electronic circuit formed of at least two circuit blocks includes electric parts being mounted on each of two outer layers of the printed wiring board so as to form at least one of the circuit blocks, wherein at least one of the circuit blocks formed on one of the outer layers is a separate design circuit block which is designed separately in accordance with a specification of a device to which the printed wiring board is applied, and at least one of the circuit blocks formed on the other of the outer layers is a common design circuit block which is used in common irrespective of the specification of the device to which the printed wiring board is applied.

According to another aspect of the present invention, wiring patterns constituting an input line to the common design circuit block formed on the other outer layer and/or an output line from the common design circuit block are formed so as to extend to a prescribed position of a board plane of the printed wiring board.

According to further aspect of the present invention, the printed wiring board has at least one inner layer, and the prescribed position is located on the at least one inner layer.

According to further aspect of the present invention, the electronic circuit is a control circuit, the separate design circuit block is a circuit block including an analog circuit which is configured to process a sensor signal received from an outside and/or to output a drive signal for driving a control object, and the common design circuit block is a circuit block including a digital arithmetic processing circuit which is configured to arithmetically process a signal from the at least one separate design circuit block and to output a signal of a result of the arithmetic processing to the at least one separate design circuit block.

According to further aspect of the present invention, an electronic device is provided with any of the above printed wiring circuit boards.

According to further aspect of the present invention, the electronic device includes a casing for accommodating the printed wiring board therein, and the printed wiring board is installed in the casing such that at least one electronic part constituting the separate design circuit block formed on the one outer layer makes direct or indirect thermal contact with the casing.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board which constitutes an electronic circuit formed of at least two circuit blocks, comprising electric parts being mounted on each of two outer layers of the printed wiring board so as to form at least one of the circuit blocks, wherein at least one of the circuit blocks formed on one of the outer layers is a separate design circuit block which is designed separately in accordance with a specification of a device to which the printed wiring board is applied, and at least one of the circuit blocks formed on the other of the outer layers is a common design circuit block which is used in common irrespective of the specification of the device to which the printed wiring board is applied,
wherein the electronic circuit is a control circuit, and the separate design circuit block is a circuit block including an analog circuit which is configured to process a sensor signal received from an outside and/or to output a drive signal for driving a control object, and
wherein the common design circuit block is a circuit block including a digital arithmetic processing circuit which is configured to arithmetically process a signal from the at least one separate design circuit block and to output a signal of a result of the arithmetic processing to the at least one separate design circuit block.

2. The printed wiring board according to claim 1, further comprising wiring patterns constituting an input line to the common design circuit block formed on the other outer layer and/or an output line from the common design circuit block, wherein the wiring patterns are configured so as to extend to a prescribed position of a board plane of the printed wiring board.

3. An electronic device comprising the printed wiring circuit board according to claim 1.

4. The electronic device according to claim 3, further comprising a casing for accommodating the printed wiring board therein, wherein the printed wiring board is installed in the casing such that at least one electronic part constituting the separate design circuit block formed on the one outer layer makes direct or indirect thermal contact with the casing.

5. A printed wiring board comprising: a first outer surface; a second outer surface opposite to the first outer surface; and an electronic circuit comprising: at least one specific design circuit block provided on the first outer surface and designed in accordance with a specification of a device to which the printed wiring board is applied; and at least one common design circuit block for a common use regardless of the specification of the device, the at least one common design circuit block being provided on the second outer surface, wherein the at least one specific design circuit block includes a first analog circuit to process a sensor signal received from a sensor disposed outside the printed wiring board; and wherein the at least one common design circuit block includes a digital arithmetic processing circuit to arithmetically process a signal output from the at least one specific design circuit block and to output a signal including a result obtained through the arithmetic processing to the at least one specific design circuit block.

6. The printed wiring board according to claim 5, further comprising:
an input line connected to the at least one common design circuit block provided on the second outer surface; and
an output line connected to the at least one common design circuit block, wherein at least one wiring pattern out of the input line and the output line extends from the at least one common design circuit to a prescribed position of the printed wiring board.

7. The printed wiring board according to claim 5,
wherein the at least one specific design circuit block includes a second analog circuit to output a drive signal to drive a control object; and
wherein the at least one common design circuit block includes a digital arithmetic processing circuit to arithmetically process a signal output from the at least one specific design circuit block and to output a signal including a result obtained through the arithmetic processing to the at least one specific design circuit block.

8. The printed wiring board according to claim 5, wherein the at least one specific design circuit block includes a second analog circuit to output a drive signal to drive a control object.

9. An electronic device comprising the printed wiring circuit board according to claim 5.

10. The electronic device according to claim 9, further comprising a casing accommodating the printed wiring board in the casing such that at least one electronic component constituting the at least one specific design circuit block provided on the first outer surface is in direct or indirect thermal contact with the casing.

11. The printed wiring board according to claim 5, further comprising:
   at least one first electric component mounted on the first outer surface as the at least one specific design circuit block; and
   at least one second electric component mounted on the second outer surface as the at least one common design circuit block.

\* \* \* \* \*